(12) United States Patent
Uetani et al.

(10) Patent No.: US 6,579,659 B2
(45) Date of Patent: Jun. 17, 2003

(54) CHEMICALLY AMPLIFIED POSITIVE RESIST COMPOSITION

(76) Inventors: Yasunori Uetani, 2-10-2-231, Sonehigashi-machi, Toyonaka-shi, Osaka (JP); Airi Yamada, 2-29-7-A205, Oike, Ibaraki-shi, Osaka (JP); Yoshiko Miya, 22-11-303, Yamanawate, Terado-cho, Muko-shi, Kyoto (JP); Yoshiyuki Takata, 2-11-7-108, Sonehigashi-machi, Toyonaka-shi, Osaka (JP)

(*) Notice: Subject to any disclaimer, the term of this patent is extended or adjusted under 35 U.S.C. 154(b) by 69 days.

(21) Appl. No.: 09/824,227

(22) Filed: Apr. 3, 2001

(65) Prior Publication Data

US 2001/0044070 A1 Nov. 22, 2001

(30) Foreign Application Priority Data

Apr. 4, 2000 (JP) .......................... 2000-101868
May 2, 2000 (JP) .......................... 2000-133328
Jul. 11, 2000 (JP) .......................... 2000-209505

(51) Int. Cl.$^7$ .............................................. G03F 7/004
(52) U.S. Cl. .................. 430/270.1; 430/905; 430/910
(58) Field of Search ........................ 430/270.1, 905, 430/910

(56) References Cited

U.S. PATENT DOCUMENTS 5,968,713 A    10/1999    Nozaki et al.

(List continued on next page.)

FOREIGN PATENT DOCUMENTS

EP           982628 A2     3/2000

(List continued on next page.)

OTHER PUBLICATIONS

Wallow et al., SPIE, vol. 2724 (1996) pp. 355–364.
Iwasa et al., J. Photopolymer Science and Technology, vol. 9, No. 3 (1996) pp. 447–456.

*Primary Examiner*—Rosemary Ashton
(74) *Attorney, Agent, or Firm*—Birch, Stewart, Kolasch & Birch, LLP

(57) ABSTRACT

A chemical amplification type positive resist composition excellent in balance of properties such as resolution, profile, sensitivity, dry etching resistance, adhesion and the like which comprises a resin which has the following polymeric units (A), (B) and (C); and an acid generating agent.

(A): At least one polymeric unit of an alicyclic lactcone selected from polymeric units represented by the following formulae (Ia) and (Ib):

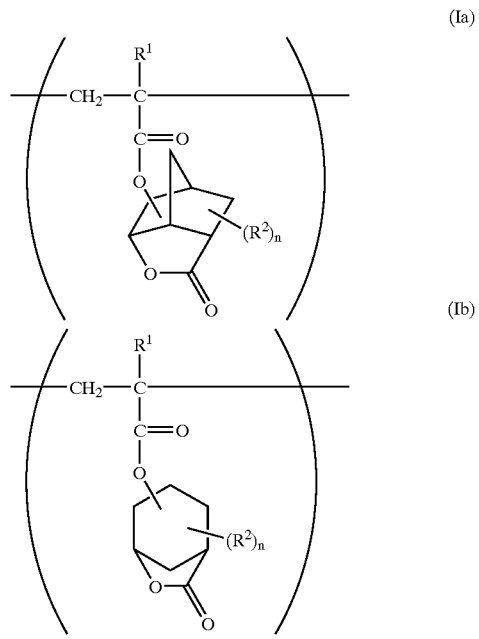

(B): At least one polymeric unit selected from a polymeric unit of 3-hydroxy-1-adamantyl (meth)acrylate represented by the following formula (II), a polymeric unit of a combination of a unit represented by the following formula (III) and a unit derived from unsaturated dicarboxylic acid anhydride selected from maleic anhydride and itaconic anhydride and a polymeric unit of (α)β-(meth)acryloyloxy-γ-butyrolactone represented by the following formula (IV):

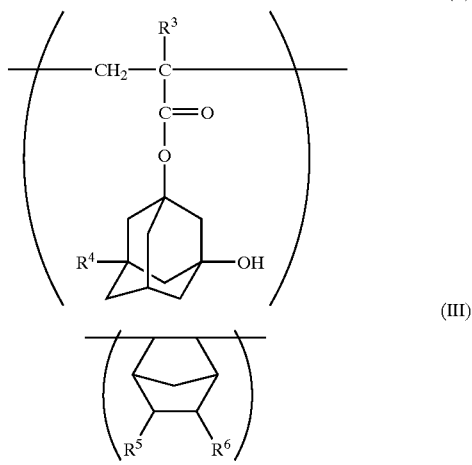

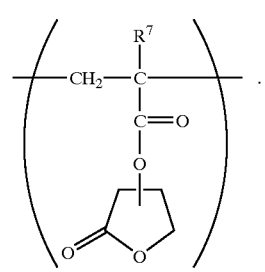

4 Claims, No Drawings

U.S. PATENT DOCUMENTS

| | | |
|---|---|---|
| 6,013,416 A | 1/2000 | Nozaki et al. |
| 6,068,512 A | 5/2000 | Sugie |
| 6,200,725 B1 | 3/2001 | Takechi et al. |
| 6,280,898 B1 | 8/2001 | Hasegawa et al. |
| 6,492,091 B2 * | 12/2002 | Kodama et al. ......... 430/270.1 |
| 2001/0003640 A1 | 6/2001 | Takechi et al. |

FOREIGN PATENT DOCUMENTS

| | | |
|---|---|---|
| JP | 9-073173 | 3/1997 |
| JP | 11-238542 | 8/1999 |
| JP | 11305444 A | 11/1999 |
| JP | 3042618 B2 | 3/2000 |
| JP | 2000-159758 | 6/2000 |
| WO | WO0001684 | 1/2000 |

* cited by examiner

CHEMICALLY AMPLIFIED POSITIVE RESIST COMPOSITION

BACKGROUND OF THE INVENTION

The present invention relates to a chemical amplifying type positive resist composition used in the micro processing of a semiconductor.

In general, a lithography process using a resist composition has been adopted in the micro processing of a semiconductor. In lithography, the resolution can be improved with a decrease in wavelength of the exposure light in principle as expressed by Rayleigh's equation related to diffraction. A g-line with a wavelength of 436 nm, an i-line with a wavelength of 365 nm, and a KrF excimer laser with a wavelength of 248 nm have been serially adopted as exposure light sources for lithography used in the manufacture of semiconductors. Thus, the wavelength has become shorter year by year. An ArF excimer laser having a wavelength of 193 nm is considered to be promising as the next-generation exposure light source.

A lens used in an ArF excimer laser exposure machine or an exposure machine using a light source of shorter wavelength has a shorter lifetime as compared with lenses for conventional exposure light sources. Accordingly, the shorter time required for exposure to ArF excimer laser light is desirable. For this reason, it is necessary to enhance the sensitivity of a resist. Consequently, there has been used a so-called chemical amplifying type resist, which utilizes the catalytic action of an acid generated due to exposure, and contains a resin having a group cleavable by the acid.

It is known that, desirably, resins used in a resist for ArF excimer laser exposure have no aromatic ring in order to ensure the transmittance of the resist, but have an alicyclic ring in place of an aromatic ring in order to impart a dry etching resistance thereto. Various kinds of resins such as those described in Journal of Photopolymer Science and Technology, Vol. 9, No, 3, pages 387–398 (1996) by D. C. Hofer, are heretofore known as such resins. Also, as a resin in a resist for an ArF excimer laser lithography, an alternating copolymer consisting of polymeric units derived from alicyclic olefin and a polymeric unit derived from an unsaturated di-carboxylic acid anhydride (Proc. SPIE, Vol. 2724, pages 355–364 (1996) by T. I. Wallow et al), a polymer comprising polymeric units derived from alicyclic lactone (JP-A-2000-26446) and the like are known.

However, using such a conventional resin, balance among properties required for resist such as resolution, profile, sensitivity, dry-etching resistance and adhesion is insufficient, and further improvement has been desired.

An object of the present invention is to provide a positive resist composition of chemical amplification type which contains a resin component and an acid generating agent and is suitable for eximer laser lithography such as ArF laser lithography, KrF laser lithography and the like, wherein the composition is excellent in balance of properties such as resolution, profile, sensitivity, dry etching resistance, adhesion and the like.

The present inventors have previously found that adhesion to a substrate can be improved by using a resin having polymeric units of 2-alkyl-2-adamantyl (meth)acrylate, unsaturated dicarboxylic anhydride, alicyclic olefin and the like, or polymeric units of 2-alkyl-2-adamantyl (meth) acrylate, 3-hydroxy-1-adamantyl (meth)acrylate and the like, as a part of polymeric units in a resin constituting a chemical amplification type positive resist composition, and have suggested this finding (JP-A-11-305444 and 11-238542). Thereafter, the present inventors have further studied, and resultantly, found that a resist composition excellent in balance of properties such as resolution, profile, sensitivity, dry etching resistance, adhesion and the like can be obtained by using a resin having polymeric units such as an alicyclic lactone, unsaturated dicarboxylic anhydride, alicyclic olefin and the like, a resin having polymeric units such as an alicyclic lactone, 3-hydroxy-1-adamantyl (meth)acrylate and the like, or a resin having polymeric units such as an alicyclic lactone, (α)β-(meth)acryloyloxy-γ-butyrolactone and the like. Thus, the present invention was completed.

SUMMARY OF THE INVENTION

The present invention provides a practically excellent chemical amplification type positive resist composition comprising a resin which has the following polymeric units (A), (B) and (C), and is insoluble itself in an alkali, but becomes alkali-soluble by the action of an acid; and an acid generating agent.

(A): At least one polymeric unit of an alicyclic lactone selected from polymeric units represented by the following formulae (Ia) and (Ib);

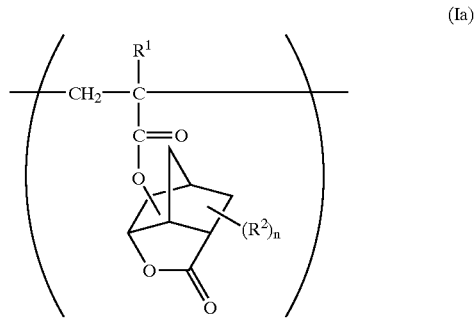

(Ia)

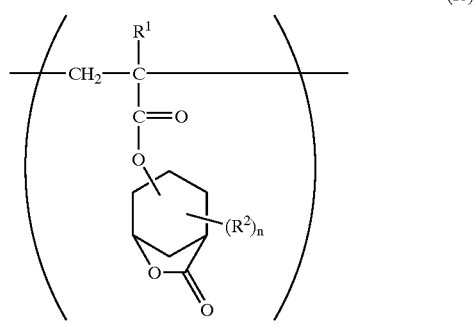

(Ib)

wherein, each of $R^1$ and $R^2$ independently represents hydrogen or methyl, and n represents a number of 1 to 3:

(B): At least one polymeric unit selected from a polymeric unit represented by the following formula (II), a polymeric unit of a combination of a unit represented by the following formula (III) and a unit derived from unsaturated dicarboxylic acid anhydride selected from maleic anhydride and itaconic anhydride and a polymeric unit represented by the following formula (IV):

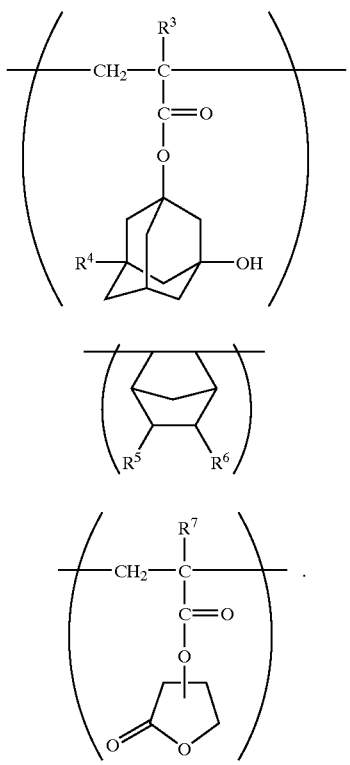

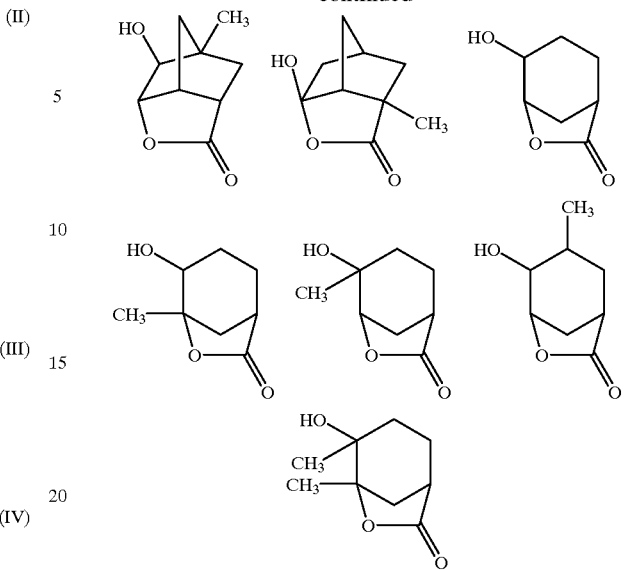

wherein, $R^3$ and $R^7$ represent hydrogen or methyl, $R^4$ represents hydrogen or hydroxyl group, each of $R^5$ and $R^6$ independently represents hydrogen, alkyl having 1 to 3 carbon atom, hydroxyalkyl having 1 to 3 carbon atoms, carboxyl, cyano or group —$COOR^7$ wherein $R^7$ is an alcohol residue, or $R^5$ and $R^6$ together form a carboxylic anhydride residue represented by —C(=O)OC(=O)—;

(C) A polymeric unit which becomes alkali-soluble by cleavage of a part of groups by the action of an acid.

The resist composition of the present invention comprises a resin having the above-mentioned polymeric units (A), (B) and (C). As the monomer used for driving polymeric units of alicyclic lactones represented by the formula (Ia) and (Ib). specifically, (meth)acrylates of alicyclic lactones having a hydroxyl groups describer below, mixtures thereof, and the like are exemplified. These esters can be produced, for example, by reacting the corresponding alicyclic lactone having a hydroxyl group and (meth)acrylic acids (e.g., JP-A 2000-26446).

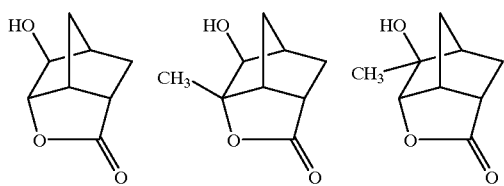

Examples of monomers used for deriving the polymeric unit of formula (II) include 3-hydroxy-1-adamantyl acrylate, 3-hydroxy-1-adamantyl methacrylate, 3,5-dihydroxy-1-adamantyl acrylate and 3,5-dihydroxy-1-adamantyl methacrylate.

These monomers can be produced, for example, by reacting corresponding hydroxyl adamantans and (meth)acrylic acids (JP-A-63-33350).

$R^5$ and $R^6$ in the formula(III) each independently represent hydrogen, alkyl having 1 to 3 carbon atoms, hydroxyalkyl having 1 to 3 carbon atoms, carboxyl, cyano or a carboxylate residue represented by —$COOR^7$ wherein $R^7$ represents an alcohol residue. Alternatively, $R^5$ and $R^6$ may together form a carboxylic acid anhydride residue represented by —C(=O)OC(=O)—. Examples of the alkyl represented by $R^5$ or $R^6$ include methyl, ethyl and propyl. Examples of the hydroxyalkyl represented by $R^5$ and $R^6$ include hydroxymethyl and 2-hydroxyethyl. Examples of the alcohol residue represented by $R^7$ include unsubstituted or substituted alkyl having about 1 to 8 carbon atoms and 2-oxoxolane-3- or -4-yl. Examples of the substituents of the substituted alkyl include hydroxyl and an alicyclic hydrocarbon residue. Specific examples of the carboxylate residue, —$COOR^7$, represented by $R^5$ and $R^6$ include methoxycarbonyl, ethoxycarbonyl, 2-hydroxyethoxycarbonyl, tert-butoxycarbonyl, 2-oxoxolane-3-yloxycarbonyl, 2-oxoxolane-4-yloxycarbonyl, 1,1,2-trimethylpropoxycarbonyl, 1-cyclohexyl-1-methylethoxycarbonyl, 1-(4-methylcyclohexyl)-1-methylethoxycarbonyl, and 1-(1-adamantyl)-1-methylethoxycarbonyl.

Examples of monomers used for deriving the unit of formula (III) include 2-norbornene, 2-hydroxy-5-norbornene, 5-norbornene-2-carboxylic acid, methyl 5-norbornene-2-carboxylate, t-butyl 5-norbornene-2-carboxylate, 1-cyclohexyl-1-methylethyl 5-norbornene-2-carboxylate, 1-(4-methylcyclohexyl)-1-methylethyl 5-norbornene-2-carboxylate, 1-(4-hydroxylcyclohexyl)-1-methylethyl 5-norbornene-2-carboxylate, 1-methyl-1-(4-oxocyclohexyl)ethyl 5-norbornene-2-carboxylate, 1-(1-adamantyl)-1-methylethyl 5-norbornene-2-carboxylate, 1-methylcyclohexyl 5-norbornene-2-carboxylate, 2-methyl-2-adamantyl 5-norbornene-2-carboxylate, 2-ethyl-2- adamantyl 5-norbornene-2-carboxylate, 2-hydroxyl-1-ethyl 5-norbornene-2-carboxylate, 5-norbornene-2-methanol and 5-norbornene-2,3-dicarboxylic acid anhydride.

The derived from unsaturated dicarboxylic acid anhydride selected from maleic anhydride and itaconic anhydride is represented by the following formula (IV) or (V):

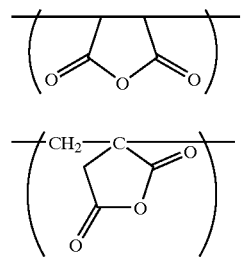

Examples of monomers used for deriving the polymeric unit of formula (IV) include α-acryloyloxy-γ-butyrolactone, α-methacryloyloxy-γ-butyrolactone, β-acryloyloxy-γ-butyrolactone and β-methacryloyloxy-γ-butyrolactone. These monomers can be produced, for example, by reacting corresponding (α)β-hydroxy-γ-butyrolactone and (meth) acrylic acids.

Due to the change in solubility in alkali of the polymeric unit (C), the resin component which is alkali-insoluble or slightly soluble in alkali becomes alkali soluble.

Various kinds of carboxylic acid ester groups may be a group cleavable by the action of acid in polymeric unit (C). Examples of the carboxylic acid ester groups include alkyl esters having about 1 to 6 carbon atoms such as tert-butylester, acetal type esters such as methoxymethylester, ethoxymethylester, 1-ethoxyethylester, 1-isobutoxyethylester, 1-isopropoxyethylester, 1-ethoxypropylester, 1-(2-methoxyethoxy)ethylester, 1-(2-acetoxyethoxy)ethylester, 1-[2-(1-adamantyloxy)ethoxy]ethylester, 1-[2-(1-adamantancarbonyloxy)ethoxy]ethylester, tetrahydro-2-furylester and tetrahydro-2-pyranylester, 2-alkyl-2-adamantyl, 1-adamantyl-1-alkylalkyl and alicyclic ester such as isobornylester. Monomers used for deriving such the carboxylic acid ester groups may be acrylic type monomer, such as acrylate and methacrylate, alicyclic type monomers bonding to a carboxylic acid ester group, such as norbornene carboxylate, tricyclodecene carboxylic acid ester and tetracyclodecene carboxylic acid ester, and alicyclic acid esters in which an acrylic acid or a methacrylic acid and an alicyclic group form an ester group, such as those described in Journal of Photopolymer Science and Technology, vol.9, No. 3, pages 447–456 (1996) by Iwasa et al.

Among the monomers listed above, monomers having a bulky group containing an alicyclic ring such as 2-alkyl-2-adamantyl-, 1-adamantyl-1-alkylalkyl or the like are preferred since they give excellent resolution. Examples of the monomers having a bulky group include 2-alkyl-2-adamantyl (meth)acrylate, 1-adamantyl-1-alkylalkyl (meth)acrylate, 2-alkyl-2-adamantyl 5-norbornene-2-carboxylate and 1-adamantyl-1-alkylalkyl5-norbornene-2-carboxylate. Particularly, 2-alkyl-2-adamantyl (meth)acrylate is preferred since it gives particularly good resolution. Representative examples of 2-alkyl-2-adamantyl (meth)acrylate include 2-methyl-2-adamantyl acrylate, 2-methyl-2-adamantyl methacrylate, 2-ethyl-2-adamantyl acrylate, 2-ethyl-2-adamantyl methacrylate and 2-n-butyl-2-adamantyl acrylate. Among them, 2-ethyl-2-adamantyl (meth)acrylate gives good balance between sensitivity and heat resistance, and, therefore, particularly preferred.

As desired, another monomer having a group cleavable by the action of acid may be used together with the above monomer.

The resin component comprised in the resist composition of the present invention can be produced by a copolymerization of a monomer from which a polymeric unit (A) is derived, a monomer from which a polymeric unit (B) is derived, a monomer from which a polymeric unit (C) is derived and one or more optional monomers used if desired.

It is usually preferred that amount of the monomer from which a polymeric unit (A) is derived is 5 to 50% by mol, amount of the monomer from which a polymeric unit (B) is derived is 10 to 80% by mol and amount of the monomer from which a polymeric unit (C) is derived is 10% to 80% by mol based on total amount of the all monomers used in the copolymerization, although the preferable ranges may vary depending on the kind of radiation used for patterning exposure and the kind of the optional monomers used if desired. When alicyclic olefin unsaturated dicarboxylic acid anhydride are used for deriving a polymeric unit of a combination of a unit of formula (III) and a unit derived from unsaturated dicarboxylic acid anhydride, they usually form an alternating copolymer.

It is advantageous that total amount of the monomer used for deriving the polymeric unit of formula (Ia) or (Ib), the monomer used for deriving the polymeric unit of formula (II), the monomer used for deriving the unit of formula (III), the monomer used for deriving the unit of unsaturated dicarboxylic acid anhydride and the monomer used for deriving the polymeric unit of formula (IV) is 20% by mol or more, more preferably 30% by mol or more, based on total amount of the all monomers including the optional monomers used in the copolymerization, even when other optional monomer is used.

The unit of formula (III) may be a polymeric unit which becomes alkali-soluble by cleavage of a part of groups by the action of an acid. In this case, the amount of the monomer used for deriving the polymeric unit (C) should be modified considering the amount of the unit of formula (III).

The copolymerization can be conducted according to a conventional method. For example, the resin (X) can be obtained by dissolving the monomers in an organic solvent, then conducting a polymerization reaction in the presence of a polymerization initiator, such as an azo compound. Examples of the azo compound include 2,2'-azobisisobutyronitrile and 2,2'-azobis(2-methylpropionate). It is advantageous that the reaction product is purified by re-precipitation or the like, after completion of the polymerization reaction.

The acid generating agent which is another component is decomposed to generate an acid by irradiating the component itself or a resist composition including the component with radioactive rays such as light and an electron beam. The acid generated from the acid generating agent acts on the resin to cleave the group which is to be cleaved by the action of an acid present in the resin. Examples of such acid generating agents include onium salt compounds, organic halogen compounds, sulfone compounds, and sulfonate compounds. Specifically, the following compounds can be mentioned: diphenyliodonium trifluoromethanesulfonate, 4-methoxyphenylphenyliodonium hexafluoroantimonate, 4-mthoxyphenylphenyliodonium trifluoromethanesulfonate, bis(4-tert-butylphenyl)iodonium tetrafluoroborate, bis(4-tert-butylphenyl)iodonium hexafluorophosphate, bis(4-tert-butylphenyl)iodonium hexafluoroantimonate, bis(4-tert-butylphenyl)iodonium trifluoromethanesulfonate,
triphenylsulfonium hexafluorophosphate,
triphenylsulfonium hexafluoroantimonate,
triphenylsulfonium trifluoromethanesulfonate,
4-methoxyphenyldiphenyl sulfonium hexafluoroantimonate;
4-methoxyphenyldiphenylsulfonium trifluoromethanesulfonate,
p-tolyldiphenylsulfonium trifluoromethanesulfonate,
p-tolyldiphenylsulfonium perfluorobutanesulfonte,
p-tolyldiphenylsulfonium perfluorooctanesulfonate,
2,4,6-trimethylphenyldiphenylsulfonium trifluoromethanesulfonate,
4-tert-butylphenyldiphenylsulfonium trifluoromethanesulfonate,
4-phenylthiophenyldiphenylsulfonium hexafluorophosphate,
4-phenylthiophenyldiphenylsuifonium hexafluoroantimonate,
1-(2-naphthoylmethyl)thiolanium hexafluoroantimonate,
1-(2-naphthoylmethyl)thiolanium trifluoromethane sulfonate,
4-hydroxy-1-naphthyldimethylsulfonium hexafluoroantimonate,
4-hydroxy-1-naphthyldimethylsulfonium trifluoromethanesulfonate,
2-methyl-4,6-bis(trichloromethyl)-1,3,5-triazine,
2,4,6-tris(trichloromethyl)-1,3,5-triazine,
2-phenyl-4,6-bis(trichloromethyl)-1,3,5-triazine,
2-(4-chlorophenyl)-4,6-bis(trichloromethyl)-1,3,5-triaizine,
2-(4-methoxyphenyl)-4,6-bis(trichloromethyl)-1,3,5-triazine,
2-(4-methoxy-1-naphthyl)-4,6-bis(trichloromethyl)-1,3,5-triazine,
2-(benzo[d][1,3]dioxolane-5-yl)-4,6-bis(trichloromethyl)-1,3,5-triazine,
2-(4-methoxystyryl)-4,6-bis(trichloromethyl)-1,3,5-triazine,
2-(3,4,5-trimethoxystyryl)-4,6-bis(trichloromethyl)-1,3,5-triazine,
2-(3,4-dimethoxystyryl)-4,6-bis(trichloromethyl)-1,3,5-triazine,
2-(2,4-dimethoxystyryl)-4,6-bis(trichloromethyl)-1,3,5-triazine,
2-(2-methoxystyryl)-4,6-bis(trichloromethyl)-1,3,5-triazine,
2-(4-butoxystyryl)-4,6-bis(trichloromethyl)-1,3,5-triazine,
2-(4-pentyloxystyryl)-4,6-bis(trichloromethyl)-1,3,5-triazine,
diphenyl disulfone,
di-p-tolyl disulfone,
bis(phenylsulfonyl)diazomethane,
bis(4-chlorophenylsulfonyl)diazomethane,
bis(p-tolylsulfonyl)diazomethane,
bis(4-tert-butylphenylsulfonyl)diazomethane,
bis(2,4-xylylsulfonyl)diazomethane,
bis(cyclohexylsulfonyl)diazomethane,
(benzoyl)(phenylsulfonyl)diazomethane,
1-benzoyl-1-phenylmethyl p-toluenesulfonate (so-called benzointosylate),
2-benzoyl-2-hydroxy-2-phenylethyl p-toluenesulfonate (so-called α-methylolbenzointosylate)
1,2,3-benzenetriyl trimethanesulfonate,
2,6-dinitrobenzyl p-toluenesulfonate,
2-nitrobenzyl p-toluenesulfonate,
4-nitrobenzyl p-toluenesulfonate,
N-(phenylsultonyloxy)succinimide,
N-(trifluoromethylsulfonyloxy)succinimide,
N-(trifluoromethylsulfonyloxy)phthalimide,
N-(trifluoromethylsulfonyloxy)-5-norbornene-2,3-dicarboxy imide,
N-(trifluoromethylsulfonyloxy)naphthalimide,
N-(10-camphorsulfonyloxy)naphthalimide, and the like.

It is also known that, generally in a chemical amplifying type positive resist composition, performance deterioration due to the deactivation of an acid associated with leaving after exposure can be reduced by adding basic compounds, especially basic nitrogen-containing organic compounds such as amines as quenchers. It is also preferable in the present invention that such basic compounds are added. Concrete examples of the basic compounds to be used as quenchers include the ones represented by the following formulae:

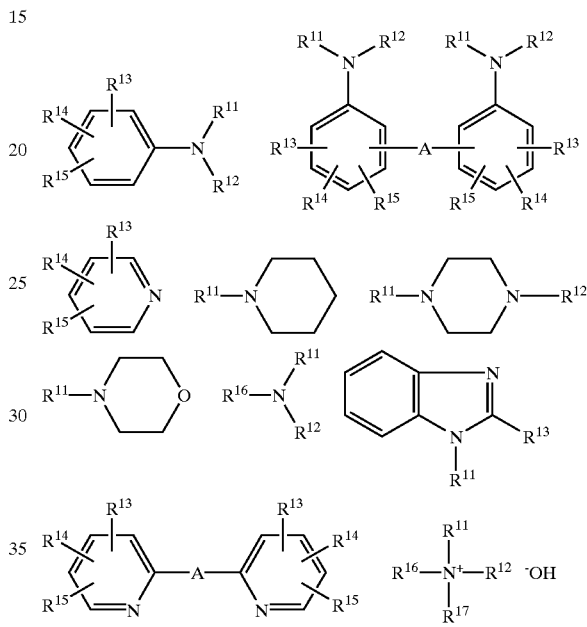

wherein $R^{11}$, $R^{12}$ and $R^{17}$ represent, independently each other, hydrogen, cycloalkyl, aryl or alkyl which may be optionally substituted with a hydroxyl, amino which may be optionally substitiuted with alkyl having 1 to 6 carbon atoms, or alkoxy having 1 to 6 carbon atoms; $R^{13}$, $R^{14}$ and $R^{15}$, which are same or different from each other, represent hydrogen, cycloalkyl, aryl, alkoxy or alkyl which may be optionally substituted with a hydroxyl, amino which may be optionally substitiuted with alkyl having 1 to 6 carbon atoms, or alkoxy having 1 to 6 carbon atoms; $R^{16}$ represents cycloalkyl or alkyl which may be optionally substituted with a hydroxyl, amino which may be optionally substitiuted with alkyl having 1 to 6 carbon atoms, or alkoxy having 1 to 6 carbon atoms; A represents alkylene, carbonyl, imino sulfide or disulfide. The alkyl represented by $R^{11}$, to $R^{17}$ and alkoxy represented by $R^{13}$ to $R^{15}$ may have about 1 to 6 carbon atoms. The cycloalkyl represented by $R^{11}$ to $R^{17}$ may have about 5 to 10 carbon atoms and the aryl represented by $R^{11}$ to $R^{15}$ and $R^{17}$ may have about 6 to 10 carbon atoms. The alkylene represented by A may have about 1 to 6 carbon atoms and may be straight-chained or branched.

The resist composition of the present invention preferably contains the resin(X) in an amount in the range of 80 to 99.9% by weight, and the acid generating agent(Y) in an of 0.1 to 20% by weight based on the total amount of the resin(X) and the acid generating agent(Y). When a basic compound is used as a quencher, it is preferably contained in an amount in the range of 0.0001 to 0.1% by weight based on the total solid component weight of the resist composition. The composition may also contain, if required, various additives such as sensitizers, dissolution inhibitors, resins other than resin(X), surfactants, stabilizers, and dyes so far as the objets of the present invention is not harmed.

The resist composition of the present invention generally becomes a resist solution in the state in which the above-described components are dissolved in a solvent to be applied on a substrate such as a silicon wafer. The solvent herein used may be one which dissolves each component, has an appropriate drying rate, and provides a uniform and smooth coating after evaporation of the solvent, and can be one which is generally used in this field. Examples thereof include glycol ether esters such as ethylcellosolve acetate, methylcellosolve acetate, and propylene glycol monomethyl ether acetate; esters such as ethyl lactate, butyl acetate, amyl acetate, and ethyl pyruvate; ketones such as acetone, methyl isobutyl ketone, 2-heptanone, and cyclohexanone; and cyclic esters such as γ-butyrolactone. These solvents can be used alone or in combination of two or more thereof.

The resist film applied on a substrate, and dried is subjected to an exposure treatment for patterning. Then, after a heat-treatment for promoting a protecting deblocking reaction, development by an alkali developer is conducted. The alkali developer herein used can be various kinds of alkaline aqueous solutions used in this field. In general, an aqueous solution of tetramethylammoniumhydroxide or (2-hydroxyethyl)trimethylammoniumhydroxide (so-called colline) is often used.

The present invention will be described in more detail by way of examples, which should not be construed as limiting the scope of the present invention. All parts in examples are by weight unless otherwise stated. The weight-average molecular weight is a value determined from gel permeation chromatography using polystyrene as a reference standard.

MONOMER SYNTHESIS EXAMPLE 1

Synthesis of 2-methyl-2-adamantyl Acrylate 166 g of 2-Methyl-2-adamantanol, 303 g of triethylamine and 500 g of methylisobutyl ketone were mixed by stirring at 60° C. While stirring, 136 g of acrylic acid chloride was added dropwise to the mixture. After completion of the dropwise addition, the mixture was stirred for six more hours. Then, extraction and distillation were conducted to obtain 2-methyl-2-adamantyl acrylate at the yield of 92%.

MONOMER SYNTHESIS EXAMPLE 2

Synthesis of 2-ethyl-2-adamantyl Methacrylate 180 g of 2-Ethyl-2-adamantanol, 303 g of triethylamine and 500 g of methylisobutyl ketone were mixed by stirring at 90° C. While stirring, 157 g of methacrylic acid chloride was added dropwise to the mixture. After completion of the dropwise addition, the mixture was further stirred for 72 hours. Then, extraction and distillation were conducted to obtain 2-ethyl-2-adamantyl methacrylate at the yield of 60%.

Herainafter, monomers represented by the following formulae are called by 5-methacryloyloxy-2,6-norbornanecarbolactone and 5-acryloyloxy-2,6-norbornanecarbolactone, respectively.

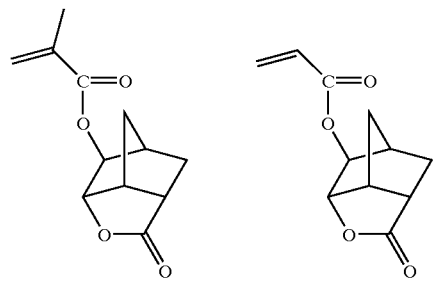

RESIN SYNTHESIS EXAMPLE 1

Synthesis of 2-ethyl-2-adamantyl Methacrylate/3-hydroxy-1-adamantyl Methacryalte/5-methacryloyloxy-2,6-norbornanecarbolactone Copolymer (Resin A1)

2-ethyl-2-adamantyl methacrylate, 3-hydroxy-1-adamantyl methacrylate and 5-methacryloyloxy-2,6-norbornanecarbolactone were charged at a molar ratio of 2:1:1 (11.2 g:5.3 g;5.0 g), and 50 g of 1.4-dioxane was added to this to give a solution. Thereto was added azobisisobutyronitrile as an initiator in an amount of 2 mol % based on the whole monomer. Then, the mixture was heated up to 85° C. and stirred for 5 hours. Thereafter, the reaction mass was poured into a large amount of heptane to cause crystallization. This crystallization operation was repeated three times to purify the resin. A copolymer having a molecular weight of about 9300 was obtained (6.3 g, yield 29%). This is called Resin Al.

RESIN SYNTHESIS EXAMPLE 2

Synthesis of 2-ethyl-2-adamantyl Methacrylate/5-acryloyloxy-2,6-norbornanecarbolactone/2-norbornene/Maleic Anhydride Copolymer (Resin A2)

2-ethyl-2-adamantyl methacrylate, 5-acryloyloxy-2,6-norbornanecarbolactone, 2-norbornene and maleic anhydride were charged at a molar ratio of 2:2:3:3 (2.48 g:2.08 g:1.41 g:1.47 g). Thereto, methylisobutyl ketone, the amount thereof being two times by weight based on the whole monomers, was added to form a monomer solution. Then, was added azobisisobutyronitrile as an initiator in an amount of 3 mol % based on the whole monomer. Under nitrogen atmosphere, the resulting mixture was heated up to 70° C. and stirred for 15 hours. Thereafter, the reaction mass was poured into a large amount of methanol to cause crystallization. This crystallization operation was repeated three times to purify the resin. A copolymer having a molecular weight of about 9230 and a molecular weight dispersion of 1.98 was obtained (5,51 g, yield 74.8%). This is called Resin A2.

RESIN SYNTHESIS EXAMPLE 3

Synthesis of 2-ethyl-2-adamantyl Methacrylate/5-methacryloyloxy-2,6-norbornanecarbolactone/α-methacryloyloxy-γ-butyrolactone Copolymer (Resin A3)

2-ethyl-2-adamantyl methacrylate, 5-methacryloyloxy-2,6-norbornanecarbolactone and α-methacryloyloxy-γ-butyrolactone were charged at a molar ratio of 2:1:1 (11.1 g:5.0 g:3.8 g), and 50 g of 1.4-dioxane was added to this to give a solution. Thereto was added 0.30 g of azobisisobutyronitrile as an initiator, then, the mixture was heated up to 85° C. and stirred for 5 hours. Then, the reaction mass was poured into a large amount of heptane to cause crystallization. This crystallization operation was repeated three times to purify the resin, obtaining a copolymer having a molecular weight of about 9100 and a molecular weight dispersion of 1.72. This is called Resin A3.

RESIN SYNTHESIS EXAMPLE 4

Synthesis of 2-methyl-2-adamantyl Methacrylate/5-methecryloyloxy-2,6-norbornanecarbolactone/α-methacryloyloxy-γ-butyrolactone Copolymer (Resin A4)

2-Methyl-2-adamantyl methacrylate, 5-methacryloyloxy-2,6-norbornanecarbolactone and α-methacryloyloxy-γ-butyrolactone were charged at a molar ratio of 2:1:1 (10.5 g:5.0 g:3.8 g), and 50 g of 1.4-dioxane was added to this to give a solution. Thereto was added 0.30 g of azobisisobutyronitrile as an initiator. Then, the mixture was heated up to 85° C. and stirred for 5 hours. Thereafter, the reaction mass was poured into a large amount of heptane to cause crystallization. This crystallization operation was repeated three times to purify the resin. A copolymer having a molecular weight of about 13600 and a molecular weight dispersion of 1.72 was obtained. This is called Resin A4.

RESIN SYNTHESIS EXAMPLE 5

Synthesis of 2-ethyl-2-adamantyl Methacrylate/5-methacryloyloxy-2,6-norbornanecarbolactone/β-methacryloyloxy-γ-butyrolactone Copolymer (Resin A5)

2-Ethyl-2-adamantyl methacrylate, 5-methacryloyloxy-2,6-norbornanecarbolactone and β-methacryloyloxy-γ-butyrolactone were charged at a molar ratio of 2:1:1 (11.2 g:5.0 g:3.8 g), and 50 g of 1.4-dioxane was added to this to give a solution. Thereto was added 0.30 g of azobisisobutyronitrile as an initiator. Then, the mixture was heated up to 85° C. and stirred for 5 hours. Thereafter, the reaction mass was poured into a large amount of heptane to cause crystallization. This crystallization operation was repeated three times to purify the resin. A copolymer having a molecular weight of about 10000 and a molecular weight dispersion of 1.72 was obtained. This is called Resin A5.

RESIN SYNTHESIS EXAMPLE 6

Synthesis of 2-methyl-2-adamantyl Methacrylate/5-methacryloyloxy-2,6-norbornanecarbolactone/β-methacryloyloxy-γ-butyrolactone Copolymer (Resin A6)

2-Methyl-2-adamantyl methacrylate, 5-methacryloyloxy-2,6-norbornanecarbolactone and β-methacryloyloxy-γ-butyrolactone were charged at a molar ratio of 2:1:1 (10.5 g:5.0 g:3.8 g), and 50 g of 1,4-dioxane was added to this to give a solution. Thereto was added 0.30 g of azobisisobutyronitrile as an initiator. Then, the mixture was heated up to 85° C. and stirred for 5 hours. Thereafter, the reaction mass was poured into a large amount of heptane to cause crystallization. This crystallization operation was repeated three times to purify the resin. A copolymer having a molecular weight of about 13000 and a molecular weight dispersion of 2.00 was obtained. This is called Resin A6.

RESIN SYNTHESIS EXAMPLE 7

Synthesis of 2-ethyl-2-adamantyl Methacrylate/3-hydroxy-1-adamantyl Methacryalte/α-methacryloyloxy-γ-butyrolactone Copolymer (Resin AX)

2-ethyl-2-adamantyl methacrylate, 3-hydroxy-1-adamantyl methacrylate and α-methacryloyloxy-γ-butyrolactone were charged at a molar ratio of 2:1:1 (20.0 g:8.9 g:6.8 g). Thereto, methylisobutyl ketone, the amount thereof being two times by weight based on the whole monomers, was added to form a monomer solution. Then, was added azobisisobutyronitrile as an initiator in an amount of 2 mol % based on the whole monomer. Then, the mixture was heated up to 85° C. and stirred for 5 hours. After cooling the reaction mass, it was poured into a large amount of heptane to cause crystallization. This crystallization operation was repeated three times to purify the resin. A copolymer having a molecular weight of about 8000 was obtained (yield 60%). This is called Resin AX.

RESIN SYNTHESIS EXAMPLE 8

Synthesis of 2-methyl-2-adamantyl Methacrylate/2-norbornene/Maleic anhydride Copolymer (Resin AY)

2-Methyl-2-adamantyl methacrylate, 2-norbornene and maleic anhydride were charged at a molar ratio of 4:3:3 (58.2 g:18.8 g:19.6 g). Thereto, tetrahydrofuran, the amount thereof being two times by weight based on the whole monomers, was added to form a monomer solution, followed by raising the temperature to 65° C. under nitrogen atmosphere. Then, was added azobisisobutyronitrile as an initiator in an amount of 3 mol % based on the whole monomer, and the resulting mixture was kept at 65° C. for 15 hours with stirring. Thereafter, the reaction mass was poured into a large amount of methanol to cause precipitation. This operation was repeated three times. A copolymer having a molecular weight of about 4710 and a molecular weight dispersion of 1.49 was obtained (61.9 g, yield 64.1%). This is called Resin AY.

RESIN SYNTHESIS EXAMPLE 9

Synthesis of 2-methyl-2-adamantyl Methacrylate/5-acryloyloxy-2,6-norbornanecarbolactone Copolymer (Resin AZ)

2-methyl-2-adamantyl methacrylate and 5-acryloyloxy-2,6-norbornanecarbolactone were charged at a molar ratio of 1:1 (3.51 g:3.12 g). Thereto, tetrahydrofuran, the amount thereof being three times by weight based on the whole monomers, was added to form a monomer solution. To the resulting solution was added azobisisobutyronitrile as an initiator in an amount of 3 mol % based on the whole monomer. Then, under the nitrogen atmosphere, the mixture was heated up to 67° C. and stirred for 5 hours. Thereafter, the reaction mass was poured into a large amount of methanol to cause crystallization. This crystallization operation was repeated three times to purify the resin. A copolymer having a molecular weight of about 16400 and a molecular weight dispersion of 2.04 was obtained (5.25 g, yield 79.2%). This is called Resin AZ.

RESIN SYNTHESIS EXAMPLE 10

Synthesis of 2-methyl-2-adamantyl Methacrylate/3-hydroxy-1-adamantyl Methacryalte/α-methacryloyloxy-γ-butyrolactone Copolymer (Resin AQ)

2-methyl-2-adamantyl methacrylate, 3-hydroxy-1-adamantyl methacrylate and α-methacryloyloxy-γ- butyrolactone were charged at a molar ratio of 5:2.5:2.5 (20.0 g:10.1 g:7.8 g). Thereto, methylisobutyl ketone, the amount thereof being two times by weight based on the whole monomers, was added to form a monomer solution. Then, was added azobisisobutyronitrile as an initiator in an amount of 2 mol % based on the whole monomer. The resulting mixture was heated up to about 85° C. and stirred for 8 hours. The resulting reaction mass was poured into a large amount of heptane to cause crystallization. This crystallization operation was repeated three times to purify the resin. A copolymer having a molecular weight of about 14500 was obtained. This is called Resin AQ.

RESIN SYNTHESIS EXAMPLE 11

Synthesis of 1-(1-adamantyl)-1-methylethyl Acrylate/5-methacryloyloxy-2,6-norbornanecarbolactone/α-methacryloyloxy-γ-butyrolactone Copolymer (Resin A7)

1-(1-adamantyl)-1-methylethyl acrylate, 5-methacryloyloxy-2,6-norbornanecarbolactone and α-methacryloyloxy-γ-butyrolactone were charged at a molar ratio of 2:1:1 (15.0 g:6.8 g:5.2 g) and 70 g of methylisobutyl ketone was added to this to give a solution. Thereto was added 0.50 g of azobisisobutyronitrile as an initiator, then, the mixture was heated up to 85° C. and stirred for 5 hours. Then, the reaction mass was poured into a large amount of heptane to cause crystallization. This crystallization operation was repeated three times to purify the resin, obtaining a copolymer having a molecular weight of about 14700 and a molecular weight dispersion of 1.78. This is called Resin A7.

RESIN SYNTHESIS EXAMPLE 12

Synthesis of 2-ethyl-2-adamantyl Methacrylate/3-hydroxy-1-adamantyl Methacryalte/5-methacryloyloxy-2,6-norbornanecarbolactone/α-methacryloyloxy-γ-butyrolactone Copolymer (Resin A8)

2-Ethyl-2-adamantyl methacrylate, 3-hydroxy-1-adamantyl methacrylate, 5-methacryloyloxy-2,6-norbornanecarbolactone and α-methacryloyloxy-γ-butyrolactone were charged at a molar ratio of 2:0.5:0.5:1 (20.0 g:4.7 g:4.5 g:6.9 g). Thereto, 80 g of 1,4-dioxane was added to this to give a solution. Thereto was added 0.50 g of azobisisobutyronitrile as an initiator, then, the mixture was heated up to 85° C. and stirred for 5 hours. The resulting reaction mass was poured into a large amount of heptane to cause crystallization. This crystallization operation was repeated three times to purify the resin, obtaining a copolymer having a molecular weight of about 13700 and a molecular weight dispersion of 1.71. This is called Resin A8.

RESIN SYNTHESIS EXAMPLE 13

Synthesis of 2-ethyl-2-adamantyl Methacrylate/5-methacryloyloxy-2,6-norbornanecarbolactone/2-norbornene/Maleic Anhydride Copolymer (Resin A9)

2-Ethyl-2-adamantyl methacrylate, 5-methacryloyloxy-2,6-norbornanecarbolactone, 2-norbornene and maleic anhydride were charged at a molar ratio of 3:3:2:2 (29.8 g:26.7 g:7.5 g:7.8 g) Thereto, methylisobutyl ketone, the amount thereof being 2.6 times by weight based on the whole monomers, was added, and the resulting solution was heated up to 89° C. under nitrogen atmosphere. Then, was added azobisisobutyronitrile as an initiator in an amount of 3 mol % based on the whole monomer, and temperature of the resulting solution was kept at 80° C. for about 15 hours. Thereafter, the reaction mass was poured into a large amount of methanol to cause crystallization. This crystallization operation was repeated three times. A copolymer having a molecular weight of about 9000 and a molecular weight dispersion of 1.96 was obtained (45.0 g, yield 62.7%). This is called Resin A9.

RESIN SYNTHESIS EXAMPLE 14

Synthesis of 2-ethyl-2-adamantyl Methacrylate/3-hydroxy-1-adamantyl Acrylate/5-methacryloyloxy-2,6-norbornanecarbolactone/2-norbornene/Maleic Anhydride Copolymer (Resin A10)

2-Ethyl-2-adamantyl methacrylate, 3-hydroxy-1-adamantyl acrylate, 5-methacryloyloxy-2,6-norbornanecarbolactone, 2-norbornene and maleic anhydride were charged at a molar ratio of 4:2:2:1:1 (37.3 g:16.7 g:16.7 g:3.5 g:3.79). Thereto, methylisobutyl ketone, the amount thereof being 2.6 times by weight based on the whole monomers, was added, and the resulting solution was heated up to 80° C. under nitrogen atmosphere. Then, was added azobisisobutyronitrile as an initiator in an amount of 3 mol % based on the whole monomer, and temperature of the resulting solution was kept at 80° C. for about 15 hours. Thereafter, the reaction mass was poured into a large amount of methanol to cause crystallization. This crystallization operation was repeated three times. A copolymer having a molecular weight of about 18700 and a molecular weight dispersion of 2.37 was obtained (60.1 g, yield 77.3%). This is called Resin A10.

RESIN SYNTHESIS EXAMPLE 15

Synthesis of 2-methyl-2-adamantyl Methacrylate/3-hydroxy-1-adamantyl Acrylate/5-methacryloyloxy-2,6-norbornanecarbolactone Copolymer (Resin A11)

2-Methyl-2-adamantyl methacrylate, 3-hydroxy-1-adamantyl acrylate and 5-methacryloyloxy-2,6-norbornanecarbolactone were charged at a molar ratio of 2:1:1 (20.0 g:9.5 g:9.5 g). Thereto, methylisobutyl ketone, the amount thereof being 2.5 times by weight based on the whole monomers, was added to give a solution. Further, azobisisobutyronitrile as an initiator was added in an amount of 3 mol % based on the whole monomer, and temperature of the resulting solution was raised to 85° C. Keeping this temperature, the solution was stirred for about 5 hours. Then, the resulting reaction mass was cooled and poured into a large amount of methanol to cause crystallization. This crystallization operation was repeated three times to purify the resin, obtaining a copolymer having an average molecular weight of about 12200. This is called Resin A11.

RESIN SYNTHESIS EXAMPLE 16

Synthesis of 2-ethyl-2-adamantyl Methacrylate/3-hydroxy-1-adamantyl Acrylate/5-methacryloyloxy-2,6-norbornanecarbolactone Copolymer (Resin A12)

2-Ethyl-2-adamantyl methacrylate, 3-hydroxy-1-adamantyl acrylate and 5-methacryloyloxy-2,6-norbornanecarbolactone were charged at a molar ratio of 2:1:1 (20.0 g:8.9 g:8.9 g). Thereto, methylisobutyl ketone, the amount thereof being 2.0 times by weight based on the whole monomers, was added to give a solution. Further, azobisisobutyronitrile as an initiator was added in an amount of 3 mol % based on the whole monomer, and temperature of the resulting solution was raised to 85° C. Keeping this temperature, the solution was stirred for about 5 hours. Then, the resulting reaction mass was cooled and poured into a large amount of methanol to cause crystallization. This crystallization operation was repeated three times to purify the resin, obtaining a copolymer having an average molecular weight of about 12300. This is called Resin A12.

RESIN SYNTHESIS EXAMPLE 17

Synthesis of 2-ethyl-2-adamantyl Methacrylate/3-hydroxy-1-adamantyl Methacrylate/5-acryloyloxy-2, 6-norbornanecarbolactone Copolymer (Resin A13)

2-Ethyl-2-adamantyl methacrylate, 3-hydroxy-1-adamantyl methacrylate and 5-acryloyloxy-2,6-norbornanecarbolactone were charged at a molar ratio of 2:1:1 (20.0 g:9.5 g:8.9 g). Thereto, 1,4-dioxane, the amount thereof being 2.5 times by weight based on the whole monomers, was added to give a solution. Further, azobisisobutyronitrile as an initiator was added in an amount of 3 mol % based on the whole monomer, and temperature of the resulting solution was raised to 85° C. Keeping this temperature, the solution was stirred for about 5 hours. Then, the resulting reaction mass was cooled and poured into a large amount of methanol to cause crystallization. This crystallization operation was repeated three times to purify the resin, obtaining a copolymer having an average molecular weight of about 8100. This is called Resin A13.

Resist compositions are prepared using the resins obtained in the above Resin Synthesis examples and the following acid generating agents and quenchers.
Acid Generating Agent
B1: p-tolyldiphenylsulfonium perfluorooctanesulfonate
B2: p-tolyldiphenylsulfonium perfluoromethanesulfonate
Quencher
C1: 2,6-diisopropylaniline

EXAMPLES AND COMPARATIVE EXAMPLES

Components listed below were mixed and dissolved, The resultant solution was filtered through a fluorine resin filter having a pore diameter of 0.2 μm to give a resist solution. In Example 2, two kinds of acid generating agents and two kinds of quenchers were used in combination.
Resin (listed in Table 1) 10 parts
Acid generating agent
(Amounts and kinds thereof are listed in Table 1):
Quencher
(Amounts and kinds thereof are listed in Table 1):
Solvent: propyleneglycol monomethylether acetate
  57 parts
  γ-butyrolactone 3 parts A silicon wafer treated with hexamethyldisilazane (Contact angle to water: 60°) was coated with a composition "DUV-30J-14" (a composition for forming organic reflection-preventing membrane, manufactured by Brewer Co. Ltd.) and baked under conditions of 215° C. for 60 seconds so that an organic reflection-preventing membrane having a thickness of 1,600 angstrom was formed on the wafer. On the silicon wafer thus prepared, the resist solution obtained above was applied by spin-coator so that the film thickness after drying was 0.39 μm. After applying the resist solution, the wafer was pre-baked on a direct hotplate at a temperature shown in Table 1, column "PB" for 60 seconds.

The wafer having a resist film formed thereon was irradiated with an ArF eximer stepper ["NSR-ArF", manufactured by Nikon, NA=0.55, σ=0.6] through a line-and-space pattern, changing the exposure amount stepwise. The exposed wafer was subjected to post-exposure baking (PEB) on a hot plate at a temperature shown in Table 1, column "PED" for 60 seconds. Then the wafer was subjected to paddle development with 2.38% by weight aqueous tetramethyl ammonium hydroxide solution for 60 seconds.

The developed bright field pattern formed on a substrate with an organic reflection-preventing membrane was observed by a scanning electron microscope and assessed for the effective sensitivity and the resolution by the following methods:

Effective sensitivity: This is expressed in the minimum amount of exposure which gave 1:1 line-and-space pattern of 0.18 μm.

Resolution: This is expressed in the minimum size which gave line-and-space pattern spitted at the exposure amount of the effective sensitivity.

Adhesion to a substrate was also evaluated by observing the pattern formed on the wafer with optical microscope according to the following criteria:

⊚: Excellent in peeling at development (fine patterns are hardly peeled even at high exposure amount.)

○: Peeling of large patterns are not observed, though peeling of some fine patterns are observed at high exposure amount.

X: Resist patterns including large patterns are completely peeled

The results are shown in Table 2.

A bright field pattern is obtained by exposure and development through a reticle comprising an outer frame formed of a chromium layer (lightproof layer) and linear chromium layers (lightproof layers) formed on a surface of a glass substrate (light-transmissive portion). Accordingly, after exposure and development, portions of the resist layer surrounding a line and space pattern is removed with a portion of the resist layer corresponding to the outer frame being left outside the line and space pattern.

T/B: This is adopted as an index for profile. Top size (T) and bottom size (B) of line-and-space pattern of 0.18 μm at the exposure amount of the effective sensitivity were measured from cross sectional photograph of the pattern. The larger the ratio of T and B (T/B) is, the better the profile is.

TABLE 1

| Example No. | Resin | Acid generator (parts) | Quencher (parts) | PB (° C.) | PEB (° C.) |
|---|---|---|---|---|---|
| Examples | | | | | |
| 1 | A1 | B1/0.2 | C1/0.0075 | 130 | 130 |
| 2 | A2 | B1/0.2 | C1/0.0075 | 110 | 115 |
| 3 | A3 | B1/0.2 | C1/0.0075 | 130 | 130 |
| 4 | A4 | B3/0.1 | C1/0.0075 | 150 | 130 |
| 5 | A5 | B1/0.2 | C1/0.0075 | 130 | 130 |
| 6 | A6 | B1/0.2 | C1/0.0075 | 130 | 130 |
| 7 | A7 | B1/0.2 | C1/0.0075 | 130 | 130 |
| 8 | A8 | B1/0.2 | C1/0.0075 | 130 | 130 |
| 9 | A9 | B1/0.2 | C1/0.0075 | 130 | 130 |
| 10 | A10 | B1/0.2 | C1/0.0075 | 130 | 130 |
| 11 | A11 | B1/0.2 | C1/0.0075 | 130 | 130 |
| 12 | A12 | B1/0.2 | C1/0.0075 | 130 | 120 |
| 13 | A13 | B1/0.2 | C1/0.0075 | 120 | 115 |

TABLE 1-continued

| Example No. | Resin | Acid generator (parts) | Quencher (parts) | PB (° C.) | PEB (° C.) |
|---|---|---|---|---|---|
| Comparative Examples | | | | | |
| 1 | AX | B1/0.2 | C1/0.0075 | 130 | 130 |
| 2 | AY | B1/0.2 | C1/0.0075 | 140 | 130 |
| 3 | AZ | B1/0.2 | C1/0.0075 | 130 | 130 |
| 4 | AQ | B3/0.1 | C1/0.0075 | 150 | 130 |

TABLE 2

| Example No. | Effective Sensitivity (mJ/cm2) | Resolution (μm) | Adhesion | T/B |
|---|---|---|---|---|
| Examples | | | | |
| 1 | 41 | 0.15 | ⊚ | 1.0 |
| 2 | 34 | 0.16 | ⊚ | 0.83 |
| 3 | 39 | 0.15 | ⊚ | 0.86 |
| 4 | 45 | 0.15 | ⊚ | 0.93 |
| 5 | 65 | 0.14 | ⊚ | 0.96 |
| 6 | 27 | 0.15 | ⊚ | 0.88 |
| 7 | 27 | 0.16 | ⊚ | 0.88 |
| 8 | 23 | 0.15 | ⊚ | 0.90 |
| 9 | 29 | 0.15 | ⊚ | 0.91 |
| 10 | 26 | 0.15 | ⊚ | 0.90 |
| 11 | 44 | 0.13 | ⊚ | 0.91 |
| 12 | 31 | 0.15 | ⊚ | 0.91 |
| 13 | 37 | 0.14 | ⊚ | 0.92 |
| Comparative examples | | | | |
| 1 | 32 | 0.15 | ⊚ | 0.72 |
| 2 | 33 | 0.17 | ○ | 0.78 |
| 3 | 36 | 0.18 | ○ | * |
| 4 | 53 | 0.16 | ⊚ | 0.82 |

*T-top, Unmeasurable

As shown in the above tables, in the Examples 1–13, which are examples of the resists of the present invention, not only profiles but also balance between sensitivity and resolution are good, and, particularly, adhesives to the substrates are excellent.

In addition to the above, the resists of Examples 1–8 exhibit good affinity (wet ability) with developer and good dry-etching resistance.

The chemical amplification type positive resist composition of the present invention is excellent in balance of properties such as resolution, profile, sensitivity, dry etching resistance, adhesion and the like. Accordingly, it is suitable for eximer laser lithography such as ArF laser lithography, KrF laser lithography and the like, and gives resist pattern of high resist performances.

What is claimed is:

1. A chemical amplification type positive resist composition comprising a resin which has the following polymeric units (A), (B) and (C), and is insoluble itself in an alkali, but becomes alkali-soluble by the action of an acid; and an acid generating agent;

(A): At least one polymeric unit of an alicyclic lactone selected from polymeric units represented by the following formulae (Ia) and (Ib):

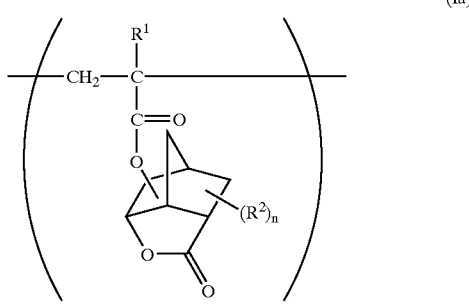

(Ia)

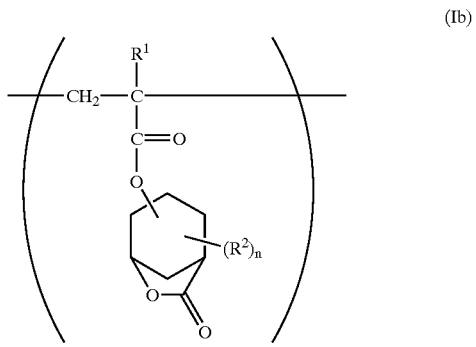

(Ib)

wherein, each of $R^1$ and $R^2$ independently represents hydrogen or methyl, and n represents a number of 1 to 3;

(B): At least one polymeric unit selected from a polymeric unit of 3-hydroxy-1-adamantyl (meth)acrylate represented by the following formula (II), a polymeric unit of a combination of a unit represented by the following formula (III) and a unit derived from unsaturated dicarboxylic acid anhydride selected from maleic anhydride and itaconic anhydride and a polymeric unit of (α)β-(meth)acryloyloxy-γ-butyrolactone represented by the following formula (IV):

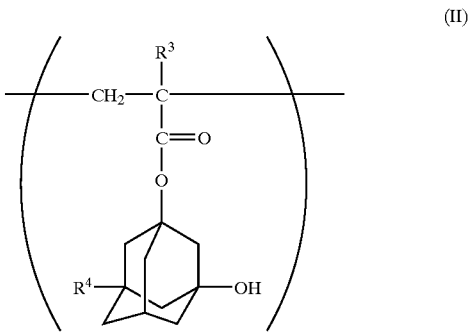

(II)

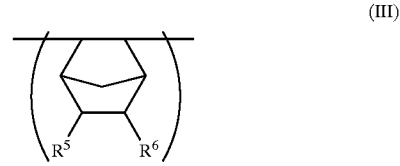

(III)

-continued

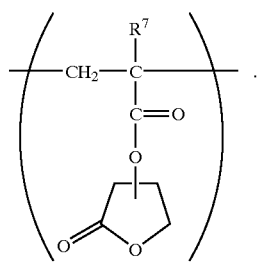

(IV)

wherein, $R^3$ and $R^7$ represent hydrogen or methyl, $R^4$ represents hydrogen or hydroxyl group, each of $R^5$ and $R^6$ independently represents hydrogen, alkyl having 1 to 3 carbon atom, hydroxyalkyl having 1 to 3 carbon atoms, carboxyl, cyano or group —COOR$^7$ wherein $R^7$ is an alcohol residue, or $R^5$ and $R^6$ together form a carboxylic anhydride residue represented by —C(=O)OC(=O)—;

(C) A polymeric unit derived from 2-alkyl-2-adamantyl (meth)acrylate which becomes alkali-soluble by cleavage of a part of groups by the action of an acid.

2. A chemical amplification type positive resist composition according to claim 1, wherein 2-alkyl-2-adamantyl (meth)acrylate is 2-ethyl-2-adamantyl (meth)acrylate.

3. A chemical amplification type positive resist composition according to claim 1, wherein the resin is produced by a copolymerization of a monomer from which a polymeric unit (A) is derived, a monomer from which a polymeric unit (B) is derived and a monomer from which a polymeric unit (C) is derived in which amount of the monomer from which a polymeric unit (A) is derived is 5 to 50% by mol, amount of the monomer from which a polymeric unit (B) is derived is 10 to 80% by mol and amount of the monomer from which a polymeric unit (C) is derived is 10 to 80% by mol based on total amount of the all monomers used in the copolymerization.

4. A chemical amplification type positive resist composition according to claim 1, which further comprises a quencher.

* * * * *